United States Patent [19]
Lin et al.

[11] Patent Number: 5,745,541
[45] Date of Patent: Apr. 28, 1998

[54] DATA SHIFT CONTROL CIRCUIT

[75] Inventors: Yi Lin; Jason Chen; Henry Fan, all of Hsinchu, Taiwan

[73] Assignee: Holtek Microelectronics, Inc., Hsinchu, Taiwan

[21] Appl. No.: 797,006

[22] Filed: Feb. 7, 1997

[51] Int. Cl.$^6$ .................................................. G11C 19/00
[52] U.S. Cl. ............................. 377/69; 377/70; 377/73
[58] Field of Search ................................. 377/2, 70, 73, 377/69; 326/105

[56] References Cited

U.S. PATENT DOCUMENTS

| | | | |
|---|---|---|---|
| 5,125,011 | 6/1992 | Fung | 377/73 |
| 5,502,408 | 3/1996 | Scholz | 377/73 |
| 5,661,418 | 8/1997 | Narayana et al. | 326/105 |
| 5,682,340 | 10/1997 | Arends et al. | 377/69 |
| 5,689,673 | 11/1997 | Kitahara | 377/69 |

*Primary Examiner*—Margaret Rose Wambach

[57] ABSTRACT

A data shift control circuit for a shift register in response to a logic operation command code is disclosed. The shift register includes a first register and a second register and the logic operation command code includes a first portion and a second portion. The circuit includes a first decoder for decoding the first portion to transmit a move signal; a second decoder for decoding the second portion to transmit a control signal; a control signal channel, electrically connected to the first register and the second register, for allowing the first register and the second register to receive the control signal and for allowing the shift register to execute a first action; and a move signal channel, electrically connected to all registers of the shift register for allowing the all registers to receive the move signal and for allowing the move register to execute a second action.

8 Claims, 6 Drawing Sheets

DATA SHIFT CONTROL CIRCUIT

FIELD OF THE INVENTION

The present invention relates to a data shift control circuit, and more particularly to a data shift control circuit for a shift register.

BACKGROUND OF THE INVENTION

Shift register are commonly used in digital circuits. The digital data stored in the shift register can be processed with the logic operations such as Shift Right (SR), Shift Left (SL), Rotate Right (RR), Rotate Left (RL), Shift Right with Carry (SRC), Shift Left with Carry (SLC), Rotate Right with Carry (RRC), and Rotate Left with Carry (RLC).

Referring to FIG. 1(a) to FIG. 1(g), the logic operation commands (S0, S1, S2) are first decoded, and the outputs from the corresponding control lines (SR, SL, RR, RL, SRC, SLC, RRC, and RLC) are decided. The registers in the shift register are then triggered to execute the corresponding operations. Finally, the desired result such as Shift or Rotate is obtained.

According to the above-mentioned descriptions, in a shift register which can execute the logic operation commands such as Shift or Rotate. every register needs eight signal lines to achieve the result. Actually, the above circuit design is really not economical. Thus, a more simplified and effective circuit structure is a must.

From the above it is seen that a more effective and simplified data shift control circuit for a shift register is often desired.

SUMMARY OF THE INVENTION

One objective of the present invention is to provide a more economical data shift control circuit for a shift register.

Another objective of the present invention is to provide a more simplified data shift control circuit for a shift register.

Still an objective of the present invention is to provide a more effective data shift control circuit for a shift register.

In a specific embodiment, the present invention provides data shift control circuit for a shift register in response to a logic operation command code. The shift register includes a first register and a second register and the logic operation command code includes a first portion and a second portion. The circuit includes a first decoder for decoding the first portion to transmit a move signal, a second decoder for decoding the second portion to transmit a control signal; a control signal channel, electrically connected to the first register and the second register, for allowing the first register and the second register to receive the control signal and for allowing the shift register to execute a first action and a move signal channel, electrically connected to all registers of the shift register for allowing the all registers to receive the move signal and for allowing the shift register to execute a second action.

Certainly, the first register can be a Most Significant Bit register, and the second register can be a Least Significant Bit register.

Certainly, the first action can include a Shift action, and the first action can include a Rotate action.

Certainly, the second action can include a Shift Left action, and the second action can include a Shift Right action.

Certainly, all of the registers can include at least 2 registers.

The foregoing and other objects, features, and advantages of the invention will be apparent from the following more particular description of a preferred embodiment of the invention, as illustrated in the accompanying drawings.

DETAILED DESCRIPTION OF THE PREFERRED EMBODIMENT

Figure 1A:
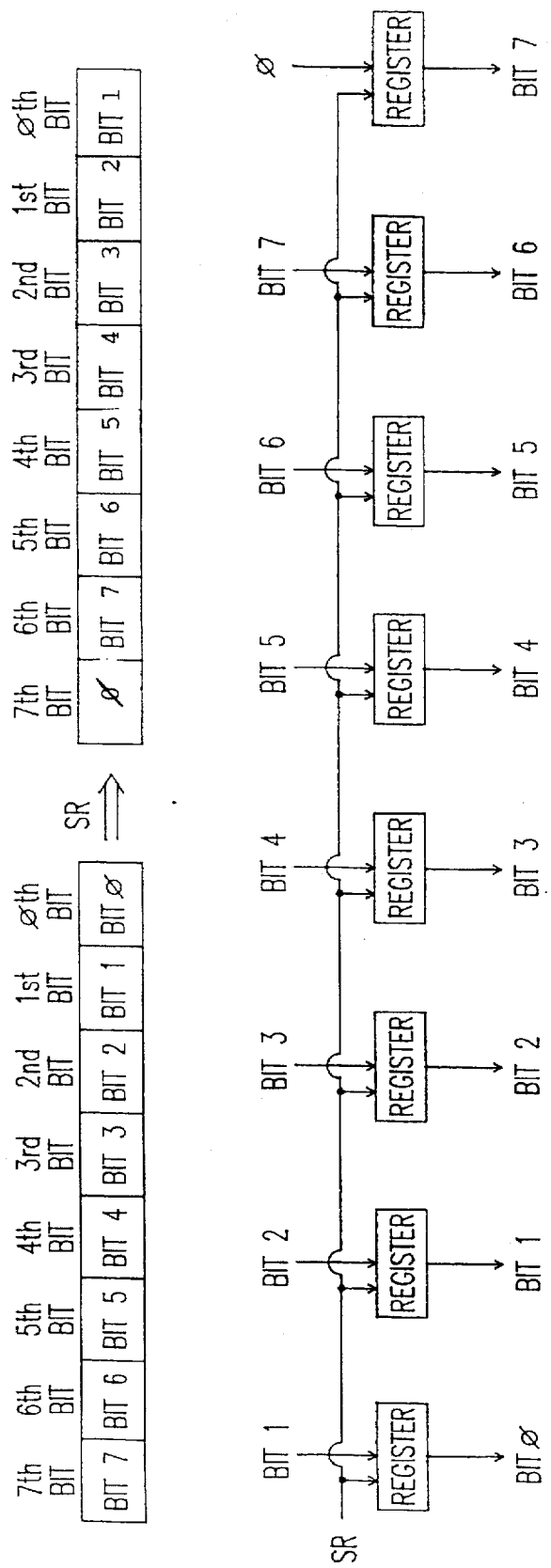
FIGS. 1(a) to 1(h) illustrate block diagrams showing the actions of Shift Right, Shift Left, Rotate Right, Rotate Left, Shift Right with Carry, Shift Left with Carry, Rotate Right with Carry, and Rotate Left with Carry.
Figure 1B:
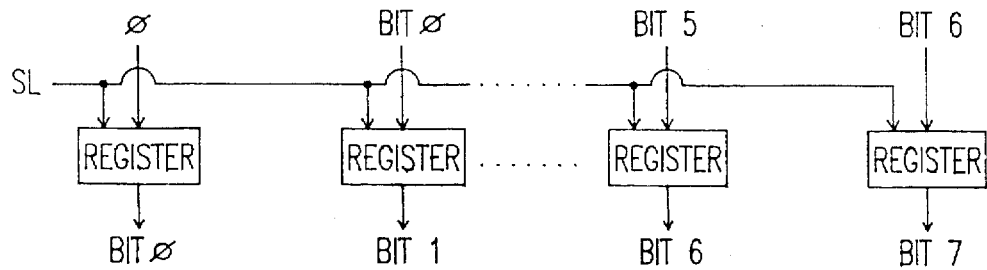
Figure 1C:
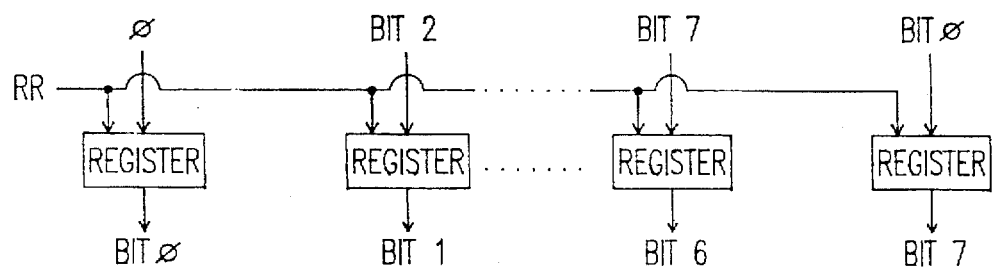
Figure 1D:
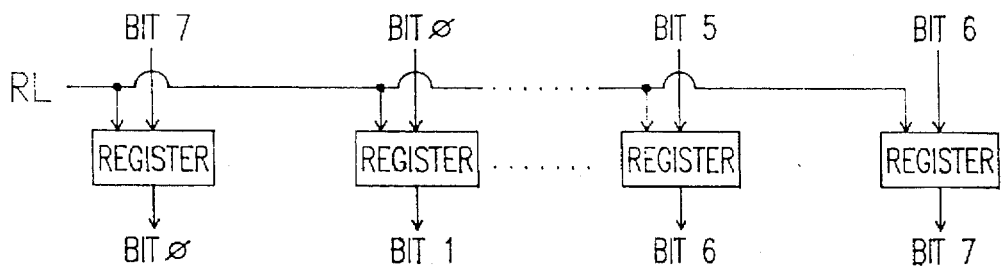
Figure 1E:
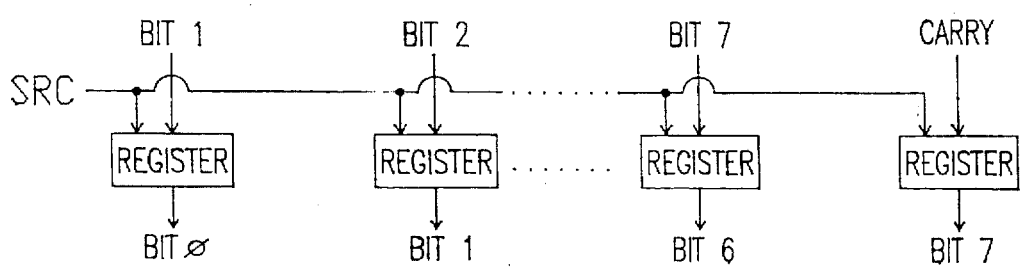
Figure 1F:
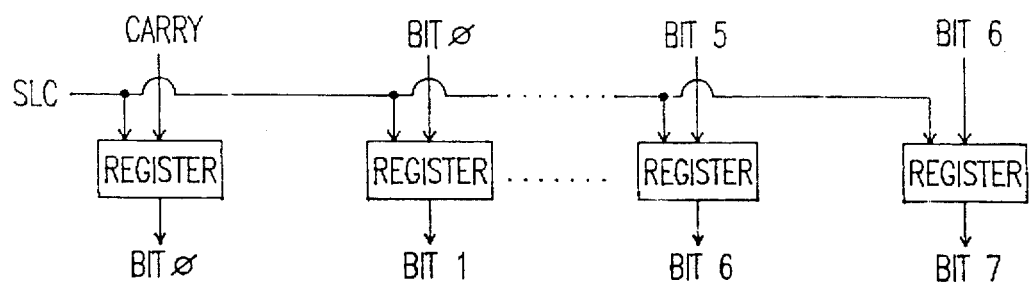
Figure 1G:
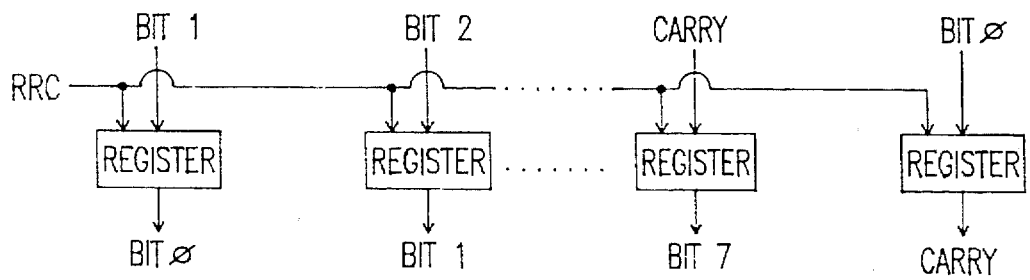
Figure 1H:
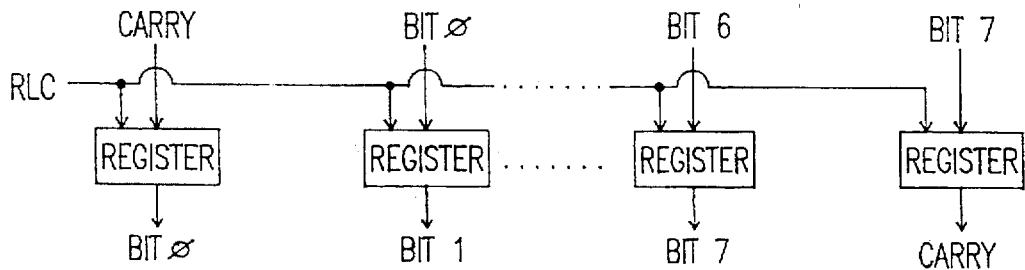
Figure 2:
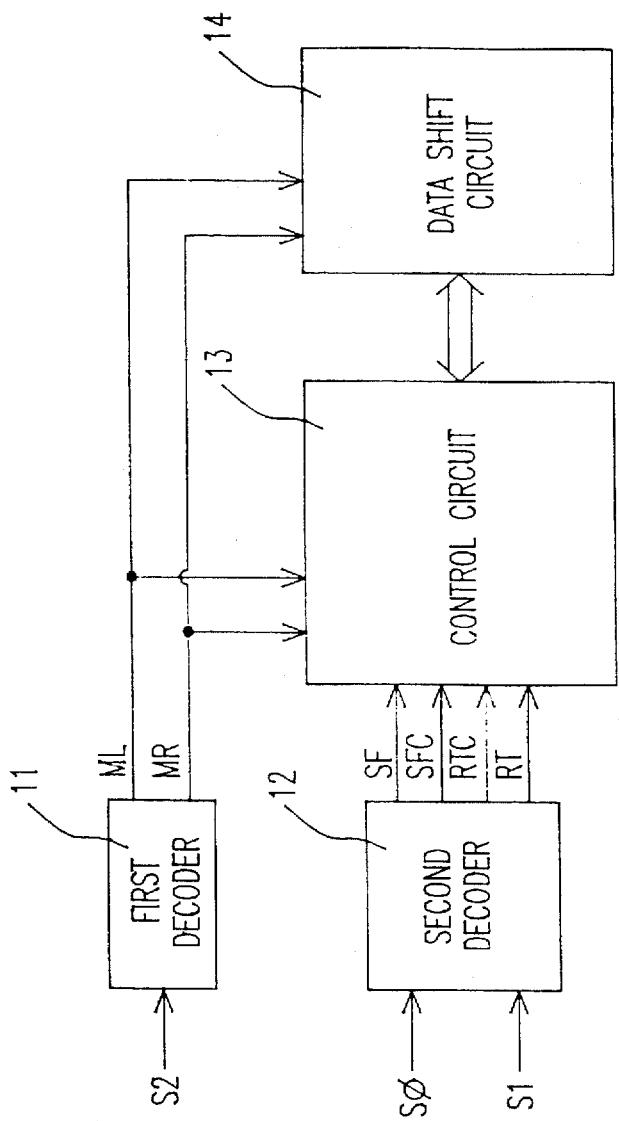
FIG. 2 illustrates a block diagram showing one preferred embodiment of the present invention.
Figure 3:
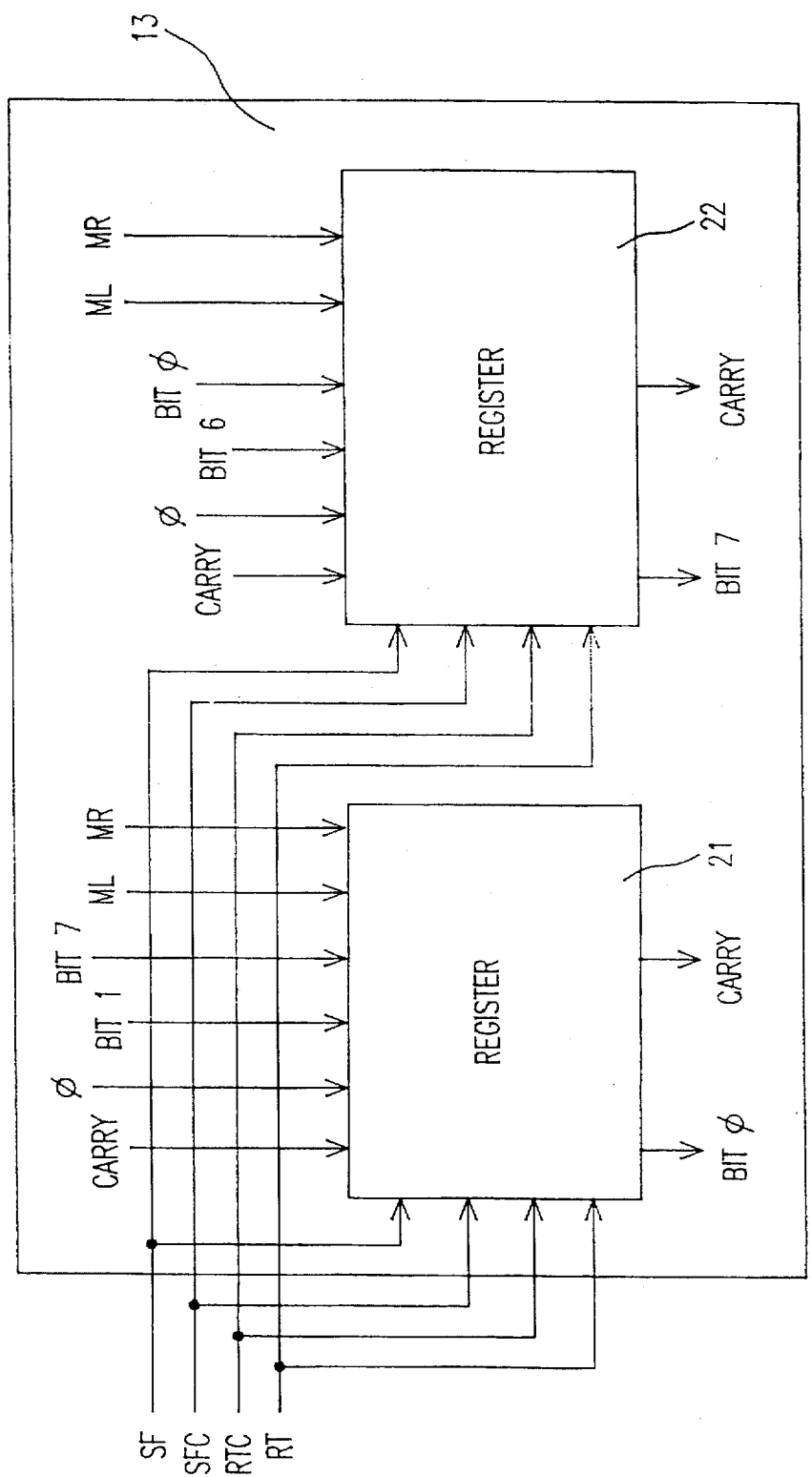
FIG. 3 illustrates a control circuit including a Most Significant Bit register and a Least Significant Bit register according to one preferred embodiment of the present invention.
Figure 4:
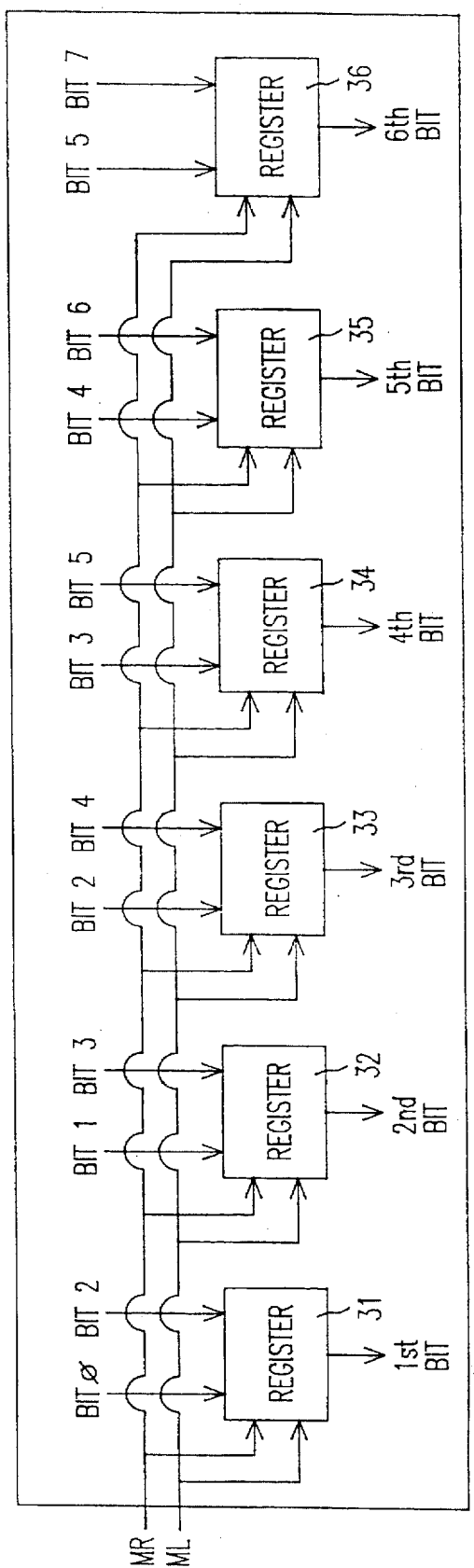
FIG. 4 illustrates a data shift circuit for a shift register according to one preferred embodiment of the present invention.

Referring to FIGS. 2, 3 and 4, the shift register includes a Most Significant Bit register (22) and a Least Significant Bit register (21) and the logic operation command code (S0, S1, S2) includes a first portion (S2) and a second portion (S0, S1). The present invention includes a first decoder (11) for decoding the first portion (S2) to transmit a move signal; a second decoder (12) for decoding the second portion (S0, S1) to transmit a control signal; a control signal channel (SF, SFC, RTC, RT), electrically connected to the Most Significant Bit register (22) and the Least Significant Bit register (21), for allowing the Most Significant Bit register (22) and the Least Significant Bit register (21) to receive the control signal and for allowing the shift register to execute a first action such as a Shift action or a Rotate action; and a move signal channel (ML, MR), electrically connected to all registers (21, 22, 31, 32, 33,34, 35, 36) of the shift register for allowing the all registers (21, 22, 31, 32, 33 34, 35, 36) to receive the move signal and for allowing the shift register to execute a second action such as a Shift Left action or a Shift Right action.

Although there are eight kinds of logic operation commands, some similarities exist in the eight commands. Taking a 8-bit shift register for example (as shown in FIG. 2), a preferred embodiment is shown. One portion of the logic operation command code (S0 and S1) is decoded by the second decoder 12 and the other position of the logic operation command code (S2) is decoded by the first decoder 11. After the decoding step, the corresponding control lines can be decided.

The eight logic operation commands Shift Right, Shift Left, Rotate Right, Rotate Left, Shift Right with Carry, Shift Left with Carry, Rotate Right with Carry, and Rotate Left with Carry can be simplified to Move Left (ML) and Move Right (MR). The portion of the logic operation command code (S2) is first decoded by the first decoder 11 to decide whether a move signal is to be transmitted. Then, the signal is transmitted to the data shift circuit 14 and the control circuit 13. As to the action category: Shift (SF), Shift with Carry (SFC), Rotate with Carry (RTC), and Rotate (RT), it is decided by the portion of the logic operation command code (S0 and S1) in the second decoder 12. Thus, a control signal is generated and transmitted to the control circuit 13.

The move signal channels (ML and MR) in the first decoder 11 is connected to every bit of the 8-bit shift register (that is, the data shift circuit 14 and the control circuit 13) so that the actions ML and MR defined by the logic operation commands can be implemented.

Referring to FIGS. 3 and 4, the hardware actions such as Shift, Shift with Carry, Rotate with Carry, Rotate are only related to the Most Significant Bit (MSB) register and the Least Significant Bit (LSB) register in the shift register, so the control signal channels such as Shift, Shift with Carry, Rotate with Carry, and Rotate are only connected to the control circuits 13 including the Most Significant Bit register and the Least Significant Bit register. The actions such as Shift, Shift with Carry, Rotate with Carry, Rotate is then well controlled.

Generally speaking, according the present invention, a simplified circuit is obtained and the application is not limited to the bit number of the shift register. In addition, according to the number of the logic operation command actions (such as Shift action and Rotate action), the bit number of the decoder can be adjusted and the complexity of the circuit can be reduced.

While the invention has been described in terms of what are presently considered to be the most practical and preferred embodiments, it is to be understood that the invention need not be limited to the disclosed embodiment. On the contrary, it is intended to cover various modifications and similar arrangements included within the spirit and scope of the appended claims which are to be accorded with the broadest interpretation so as to encompass all such modifications and similar structures. Therefore, the above description and illustration should not be taken as limiting the scope of the present invention which is defined by the appended claims.

What is claimed is:

1. A circuit for controlling a shift register in response to a logic operation command code, said shift register comprising a first register and a second register and said logic operation command code comprising a first portion and a second portion, comprising:

a first decoder for decoding said first portion to transmit a move signal;

a second decoder for decoding said second portion to transmit a control signal;

a control signal channel, electrically connected to said first register and said second register, for allowing said first register and said second register to receive said control signal and for allowing said shift register to execute a first action; and a move signal channel, electrically connected to all registers of said shift register for allowing said all registers to receive said move signal and for allowing said shift register to execute a second action.

2. A circuit as set forth in claim 1 wherein said first register is a Most Significant Bit register.

3. A circuit as set forth in claim 1 wherein said second register is a Least Significant Bit register.

4. A circuit as set forth in claim 1 wherein said first action comprises a Shift action.

5. A circuit as set forth in claim 1 wherein said first action comprises a Rotate action.

6. A circuit as set forth in claim 1 wherein said second action comprises a Shift Left action.

7. A circuit as set forth in claim 1 wherein said second action comprises a Shift Right action.

8. A circuit as set forth in claim 1 wherein said all registers comprises at least 2 registers.

* * * * *